(12) United States Patent
Xiao et al.

(10) Patent No.: US 11,549,999 B2
(45) Date of Patent: Jan. 10, 2023

(54) HIGH VOLTAGE INTERLOCK DEVICE AND DETECTION METHOD THEREOF

(71) Applicant: Contemporary Amperex Technology Co., Limited, Ningde (CN)

(72) Inventors: Qi Xiao, Ningde (CN); Yanhui Fu, Ningde (CN); Xingchang Wang, Ningde (CN); Changjian Liu, Ningde (CN)

(73) Assignee: Contemporary Amperex Technology Co., Limited, Ningde (CN)

( * ) Notice: Subject to any disclaimer, the term of this patent is extended or adjusted under 35 U.S.C. 154(b) by 0 days.

(21) Appl. No.: 17/828,079

(22) Filed: May 31, 2022

(65) Prior Publication Data

US 2022/0291295 A1  Sep. 15, 2022

Related U.S. Application Data

(63) Continuation of application No. PCT/CN2021/081138, filed on Mar. 16, 2021.

(30) Foreign Application Priority Data

Jun. 12, 2020 (CN) .......................... 202010538231.3

(51) Int. Cl.
*G01R 31/52* (2020.01)
*G01R 19/10* (2006.01)
*B60L 3/00* (2019.01)

(52) U.S. Cl.
CPC ............. *G01R 31/52* (2020.01); *G01R 19/10* (2013.01); *B60L 3/0046* (2013.01)

(58) Field of Classification Search
CPC ........ G01R 31/52; G01R 19/10; B60L 3/0046
See application file for complete search history.

(56) References Cited

U.S. PATENT DOCUMENTS

| 11,280,834 B2 * | 3/2022 | Schweitzer, III | G01R 31/58 |
| 2014/0001840 A1 * | 1/2014 | Lenz | B60R 16/02 |
| | | | 307/9.1 |
| 2022/0052519 A1 * | 2/2022 | Voyer | H02H 7/268 |

(Continued)

FOREIGN PATENT DOCUMENTS

| CN | 103036238 A | 4/2013 |
| CN | 205097957 U | 3/2016 |

(Continued)

OTHER PUBLICATIONS

The International search report for PCT Application No. PCT/CN2021/081138, dated May 27, 2021, 14 pages.

(Continued)

*Primary Examiner* — Alvaro E Fortich
*Assistant Examiner* — Zannatul Ferdous
(74) *Attorney, Agent, or Firm* — East IP P.C.

(57) ABSTRACT

The application provides a high voltage interlock circuit and a detection method thereof, the high voltage interlock circuit comprises: a signal isolation conversion module, and a fault detection module. The high voltage interlock device and the detection method thereof provided by the embodiments of the application can avoid the damage to the fault detection module caused by large external voltage, and improve the safety of the high voltage interlock device.

17 Claims, 5 Drawing Sheets

(56) References Cited

U.S. PATENT DOCUMENTS

| | | | | |
|---|---|---|---|---|
| 2022/0057443 | A1* | 2/2022 | Trunk | .................. G01R 31/007 |
| 2022/0120823 | A1* | 4/2022 | Nakayama | ............... H02H 3/17 |

FOREIGN PATENT DOCUMENTS

| | | |
|---|---|---|
| CN | 104203635 B | 9/2016 |
| CN | 106154145 A | 11/2016 |
| CN | 208156074 U | 11/2018 |
| CN | 109017317 A | 12/2018 |
| CN | 109100597 A | 12/2018 |
| CN | 208334558 U | 1/2019 |
| CN | 109541494 A | 3/2019 |
| CN | 109683109 A | 4/2019 |
| CN | 109789790 A | 5/2019 |
| CN | 209044598 U | 6/2019 |
| CN | 110244175 A | 9/2019 |
| CN | 110341483 A | 10/2019 |
| CN | 110673008 A | 1/2020 |
| CN | 110824380 A | 2/2020 |
| CN | 110967617 A | 4/2020 |
| CN | 113777521 A | 12/2021 |

OTHER PUBLICATIONS

The extended European search report for EP Application No. 21748483.1, dated Apr. 25, 2022, 9 pages.
The First Office Action and search report dated Jun. 8, 2022 for Chinese Application No. 202010538231.3, 17 pages.
The Second Office Action and search report dated Sep. 27, 2022 for Chinese Application No. 202010538231.3, 7 pages.

* cited by examiner

HIGH VOLTAGE INTERLOCK DEVICE AND DETECTION METHOD THEREOF

CROSS-REFERENCE TO RELATED APPLICATIONS

The present application is a continuation of International Application No. PCT/CN2021/081138, filed on Mar. 16, 2021, which claims priority to Chinese patent application No. 202010538231.3 entitled "HIGH VOLTAGE INTERLOCK DEVICE AND DETECTION METHOD THEREOF" filed on Jun. 12, 2020, both of which are hereby incorporated by reference in their entireties.

FIELD OF THE INVENTION

The present application relates to the field of battery technology, in particular to a high voltage interlock device and a detection method thereof.

BACKGROUND OF THE INVENTION

With the rapid development of new energy vehicles, people pay more and more attention to the safety of the new energy vehicles. The biggest difference between new energy vehicles and traditional vehicles is that new energy vehicles rely on high voltage and large current to provide power for vehicles, thus the high voltage safety problem cannot be ignored in the design of new energy vehicles. A common safety monitoring system for high voltage circuit is high voltage interlock device, which is mainly used to monitor on-off situation of various high voltage components (including high voltage connector, manual service disconnect (Manual Service Disconnect, MSD), or high voltage power supply equipment, etc.) in electric vehicles. Based to the detection situation, a vehicle controller can determine whether to disconnect the high voltage circuit, so that the vehicle is in a safe state.

In the existing detection scheme, the signals collected at both ends of high voltage components are directly input to a fault detection device. When there is a large external voltage, the fault detection device may be directly damaged, which is unable to guarantee the safety of the high voltage interlock device.

SUMMARY OF THE INVENTION

The high voltage interlock device and the detection method thereof according to the embodiments of the application may avoid the damage to the fault detection module caused by large external voltage, and improve the safety of the high voltage interlock device.

On the one hand, the embodiments of the application provide a high voltage interlock device, including: a signal isolation conversion module, an input terminal of the signal isolation conversion module is connected to one terminal of a high voltage component to be detected, and an output terminal of the signal isolation conversion module is connected to a fault detection module, the signal isolation conversion module is used to convert a first target electrical signal at one terminal of the high voltage component to be detected into a first electrical signal to be detected on the premise of ensuring that the high voltage component to be detected is isolated from the fault detection module, wherein the other terminal of the high voltage component to be detected is connected to a first power supply terminal; the fault detection module for determining the fault of the high voltage component to be detected based on the first electrical signal to be detected.

On the other hand, the embodiments of the application provide a detection method for a high voltage interlock device, which is applied to the high voltage interlock device according to the embodiments of the application, the method including: converting, by a signal isolation conversion module, a first target electrical signal at one terminal of a high voltage component to be detected into a first electrical signal to be detected on the premise of ensuring that the high voltage component to be detected is isolated from a fault detection module, and sending the first electrical signal to be detected to the fault detection module; determining, by the fault detection module, the fault of the high voltage component to be detected based on the first electrical signal to be detected.

According to the high voltage interlock device and its detection method in the embodiments of the application, since the high voltage interlock device includes a signal isolation conversion module, the signal isolation conversion module is able to convert an electrical signal at one terminal of a high voltage component to be detected into an electrical signal to be detected, and send the electrical signal to be detected to a fault detection module, for detecting the fault of the high voltage component to be detected by the fault detection module according to the electrical signal to be detected. Therefore, there is no direct connection between the high voltage component to be detected and the fault detection module, which can isolate the high voltage component to be detected from the fault detection module, avoiding the damage to the fault detection module caused by target electrical signal output from the high voltage component to be detected, and improving the safety of the high voltage interlock device.

BRIEF DESCRIPTION OF THE DRAWINGS

In order to illustrate the technical solution of the embodiments of the application more clearly, the drawings needed to be used in the embodiments of the application will be briefly introduced below. It is obvious that the drawings described below are only some embodiments of the application. For ordinary technicians in the art, other drawings may also be obtained from the drawings below without paying creative labor.

Figure 1:
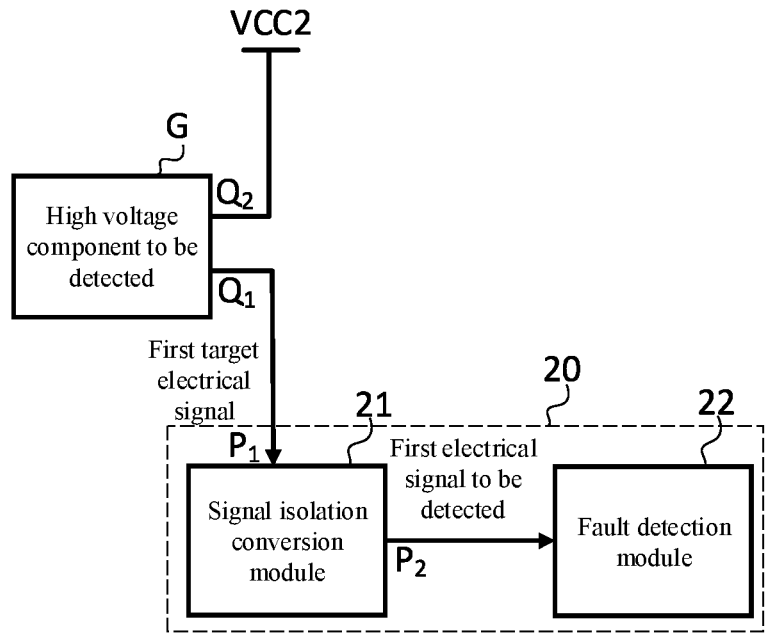
FIG. 1 is a structural diagram for a high voltage interlock device according to the embodiments of the application.

In the drawings, they are not drawn to actual scale.

DETAILED DESCRIPTION

The embodiments of the present application are further described in detail in combination with the drawings and the embodiments. The following detailed description and drawings of the embodiments are used to illustrate the principle of the application as example, but not to limit the scope of the application, that is, the application is not limited to the described embodiments.

In the description of the application, it is noted that unless otherwise specified, "multiple" means more than two; the orientation or position relationship indicated by the terms "up", "down", "left", "right", "inside", "outside" is only for the convenience of describing the application and simplifying the description, rather than indicating or implying that the device or element referred to must have a specific orientation, be constructed and operated in a specific orientation, so it cannot be understood as a limitation of the application. In addition, the terms "first", "second", "third" and so on are used for descriptive purposes only, and cannot be understood to indicate or imply relative importance. "Perpendicular" is not perpendicular in the strict sense, but within the allowable range of error. "Parallel" is not parallel in the strict sense, but within the allowable range of error.

The orientation words appearing in the following description are all the directions shown in the FIG.s, and are not intended to limit the specific structure of the application. In the description of the application, it should also be noted that unless otherwise specified and limited, the terms "install", "interconnect" and "connect" should be understood in a broad sense. For example, it may be fixed connection, detachable connection or integrated connection; and it may be connected directly or indirectly through intermediate media. For those skilled in the art, the specific meaning of the above terms in the application can be understood according to the specific situation.

The embodiments of the application provide a high voltage interlock device and a detection method thereof, which are suitable for the specific scene of fault detection for high voltage devices. The high voltage interlock device according to the embodiments of the application includes a signal isolation conversion module, which can convert an electrical signal at one terminal of the high voltage component to be detected into an electrical signal to be detected, and transmit the electrical signal to be detected to a fault detection module, for detecting the fault of the high voltage component to be detected by the fault detection module according to the electrical signal to be detected. There is no direct connection between the high voltage component to be detected and the fault detection module, which can isolate the high voltage component to be detected from the fault detection module, avoiding the damage to the fault detection module caused by target electrical signal output from the high voltage component to be detected, and improving the safety of the high voltage interlock device.

In addition, for the high voltage component to be detected, if the high voltage component to be detected has no fault, the high voltage component to be detected is in a normal state. If the fault of the high voltage component to be detected exists, the fault types of the high voltage component to be detected specifically may include short-connected power supply fault, short-connected ground fault and open circuit fault. Therein the short-connected power supply fault means that either or both ends of the high voltage component to be detected is short-connected to power supply, and the short-connected power supply may be unknown power supply. The short-connected ground fault means that either or both ends of the high voltage component to be detected is short-connected to ground. Open circuit fault means that the high voltage component to be detected is always turned off, that is to say, the high voltage component to be detected is always electrically disconnected.

FIG. 1 is a structural diagram of a high voltage interlock device according to the embodiments of the application. As shown in FIG. 1, the high voltage interlock device 20 includes a signal isolation conversion module 21 and a fault detection module 22. In one embodiment, the high voltage interlock device 20 in the embodiments of the application can be realized as a high voltage interlock circuit, or other structure that can realize the functions of the high voltage interlock device 20 in the embodiments of the application, which is not specifically limited.

An input terminal $P_1$ of the signal isolation conversion module 21 is connected to one terminal $Q_1$ of the high voltage component G to be detected, and an output terminal $P_2$ of the signal isolation conversion module 21 is connected to the fault detection module 22. The signal isolation conversion module 21 is used to convert a first target electrical signal at one terminal $Q_1$ of the high voltage component G to be detected into a first electrical signal to be detected on the premise of ensuring that the high voltage component G to be detected is isolated from the fault detection module 22, wherein the other terminal $Q_2$ of the high voltage component G to be detected is connected to a first power supply terminal VCC2. In the embodiments of the application, the voltage of the first power supply terminal VCC2 is less than or equal to the voltage of the low voltage power supply in the vehicle. In some embodiments, the first power supply terminal VCC2 may be the low voltage power supply of the whole vehicle. In one example, the first power supply terminal VCC may be the battery of the whole vehicle, such as lead-acid battery or lithium battery. It should be noted that the battery of the whole vehicle may also be other types of batteries, and the embodiments of the present application are not limited to this.

The fault detection module 22 is used to determine the fault of the high voltage component G to be detected based on the first electrical signal to be detected. Wherein the fault detection module 22 may be specifically implemented as an original control element of target vehicle such as motor control unit (Motor Control Unit, MCU), or the fault detection module 22 may be a newly added detection module, which is not limited.

According to the high voltage interlock device 20 in the embodiments of the application, since the high voltage interlock device 20 includes a signal isolation conversion module 21, the signal isolation conversion module 21 can convert a target electrical signal of at one terminal $Q_1$ of the high voltage component G to be detected into an electrical signal to be detected, and transmit the electrical signal to be detected to the fault detection module 22, for detecting the fault of the high voltage component G to be detected by the fault detection module 22 according to the electrical signal to be detected. Therefore, there is no direct connection between the high voltage component G to be detected and the fault detection module 22, which can isolate the high voltage component G to be detected from the fault detection module 22, avoiding the damage to the fault detection module 22 caused by target electrical signal output from the high voltage component G to be detected, and improving the safety of the high voltage interlock device.

In some embodiments, the signal isolation conversion module 21 includes a driving unit 211 and a first switching unit 212 arranged in isolation. As an example, FIG. 2 is a structural diagram of an exemplary high voltage interlock device according to the embodiments of the application.

Figure 2:
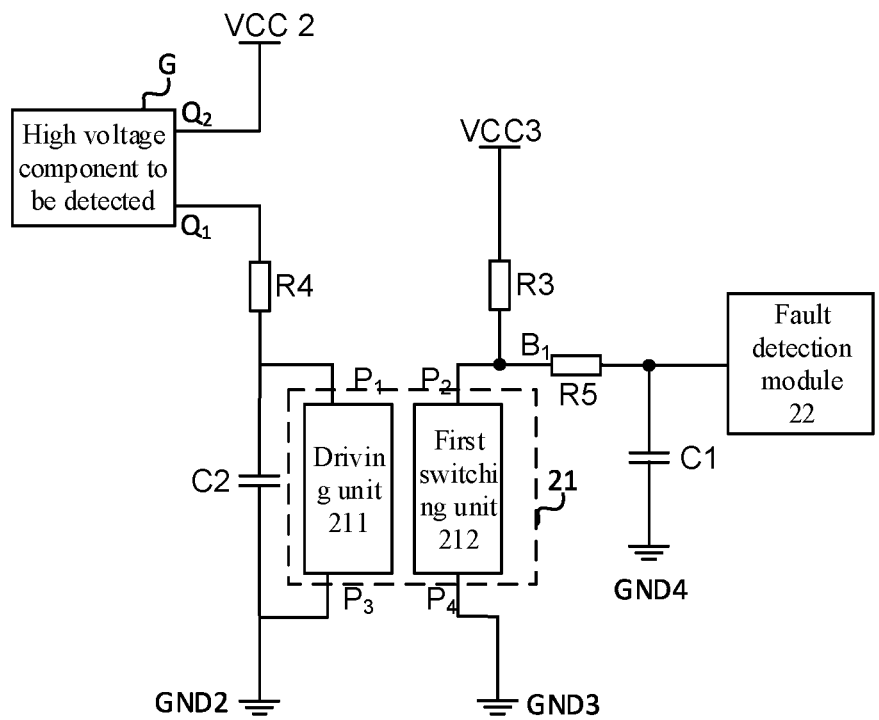
FIG. 2 is a structural diagram for an exemplary high voltage interlock device according to the embodiments of the application.

Firstly, for the driving unit 211 shown in FIG. 2, one terminal $P_1$ of the driving unit 211 is connected to one terminal $Q_1$ of the high voltage component G to be detected, and correspondingly, one terminal $P_1$ of the driving unit 211 is used as an input of the signal isolation conversion module 21. The other terminal $P_3$ of the driving unit 211 is connected to a first reference potential. As an example, as shown in FIG. 2, the other terminal $P_3$ of the driving unit 211 is connected to a second ground GND2.

The driving unit 211 may convert the first target electrical signal into the other form of signal than electrical signal, and transmit the other form of signal to the first switching unit 212. Wherein the first target electrical signal can be the voltage across the driving unit, that is, the voltage difference between one terminal $P_1$ of the driving unit 211 and the other terminal $P_3$ of the driving unit 211. In one embodiment, the other form of signal above may be an optical signal, and accordingly, the driving unit 211 may include a light emitting element capable of converting an electrical signal into an optical signal. For example, light-emitting diode. Wherein the appropriate driving unit 211 can be selected according to the operating scenario and operating requirements, and the specific implementation of the driving unit 211 is not limited.

Secondly, for the first switching unit 212 shown in FIG. 2, one terminal $P_2$ of the first switching unit 212 is connected to the fault detection module 22. Accordingly, one terminal $P_2$ of the first switching unit 212 is used as an output $P_2$ of the signal isolation conversion module 21. And one terminal $P_2$ of the first switching unit 212 is also connected to a second power supply terminal VCC3 through a first voltage dividing module R3. In some embodiments, the voltage output by the second power supply terminal is less than the voltage output by the first power supply terminal. If the first power supply terminal VCC2 is a low-voltage power supply of the vehicle, such as lead-acid battery, etc. Since the low-voltage power supply often outputs 12V or 24V voltage, the voltage range of the second power supply terminal may be (0, 12 v) and (0, 24 v) respectively. For example, the voltage of the second power terminal may be 5V.

The other terminal $P_4$ of the first switching unit 212 is connected to a second reference potential. For example, as shown in FIG. 2, the other terminal $P_4$ of the first switching unit 212 is connected to a third ground GND3. The first voltage dividing module R3 can be specifically implemented as one or more resistors. In addition, the first voltage dividing module may also be realized as other devices or modules with voltage dividing function, which is not limited by the embodiments of the application.

The first switching unit 212 may respond to the other form of signal and convert the other form of signal into a first electrical signal to be detected. Wherein the first electrical signal to be detected may be a voltage at a certain point on the connection line between the first switching unit 212 and the first voltage dividing module R3, and for example, a voltage at the sampling point $B_1$. In one embodiment, if the other form of signal described above is an optical signal, the first switching unit 212 may correspondingly include a photosensitive element capable of converting the optical signal into an electrical signal. For example, photodiode, phototriode, optical metal oxide semiconductor field-effect transistors (MOS), etc. which are not limited. Wherein, the appropriate first switching unit 212 can be selected according to the operating scenario and operating requirements, and the specific implementation of the first switching unit 212 is not limited.

Again, the specific working principle for the signal isolation conversion module 21 shown in FIG. 2 is explained as follows: the driving unit 211 is used to drive the first switching unit 212 to turn on or turn off. Specifically, if the voltage of the first target electrical signal is greater than the voltage $V_{G1}$ of the first reference potential, the first target electrical signal is a high-level signal, the driving unit 211 drives the first switching unit 212 to turn on, and the first electrical signal to be detected is a low-level signal. At this time, there is conduction between the second power supply terminal VCC3 and the second reference potential. In an ideal state, if the partial voltage of the first switching unit is considered to be 0, the voltage $V_{det1}$ of the first electrical signal to be detected collected from the sampling point $B_1$ is equal to the voltage $V_{G2}$ of the second reference potential. That is to say, the voltage of the low level signal is equal to the voltage $V_{G2}$ of the second reference potential. In addition, if the voltage of the first target electrical signal is less than or equal to the voltage $V_{G1}$ of the first reference potential, the first target electrical signal is a low-level signal, and the driving unit 211 is unable to drive the first switching unit 212 to turn on, that is, the first switching unit 212 is turned off, and the first electrical signal to be detected is a high-level signal. At this time, the second power supply terminal VCC3 is disconnected from the second reference potential. In an ideal state, each point on the connection line between the second power supply terminal VCC3 and the output terminal $P_2$ of the first switching unit can be considered to equal potential, that is, the potential of each point on the connection line is equal to the voltage $V_{CC3}$ of the second power supply terminal VCC3. Accordingly, the voltage $V_{det1}$ of the first electrical signal to be detected collected from the sampling point $B_1$ is equal to the voltage $V_{CC3}$ of the second power supply terminal VCC3. That is to say, the voltage of the high level signal is equal to the voltage $V_{CC3}$ of the second power supply terminal VCC3.

Figure 3:
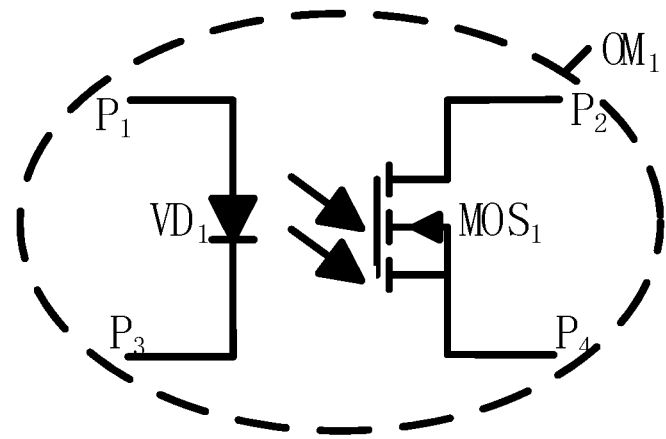
FIG. 3 shows a structure diagram for an exemplary signal isolation conversion module.

Finally, a specific example is given for the signal isolation conversion module 21 shown in FIG. 2. FIG. 3 shows a block diagram of an exemplary signal isolation conversion module. As shown in FIG. 3, the signal isolation conversion module can be specifically implemented as an optical coupler $OM_1$.

Wherein the driving unit 211 can be specifically implemented as a light emitting diode $VD_1$. An anode of the light emitting diode $VD_1$ is used as the input $P_1$ of the signal isolation conversion module 21. A cathode of the light emitting diode $VD_1$ is used as the other terminal $P_3$ of the driving unit 211.

The first switching unit 212 can be specifically implemented as a photoelectric MOS $MOS_1$. Wherein the drain of $MOS_1$ is one terminal $P_2$ of the first switching unit 212, and the source of $MOS_1$ is the other terminal $P_4$ of the first switching unit 212. Specifically, if an optical signal is sensed by the gate of $MOS_1$, a path is formed between the source and drain of $MOS_1$. If no optical signal is sensed by the gate of $MOS_1$, the source and drain of MOS1 are disconnected.

As shown in FIG. 2, in some embodiments, for the fault detection module 22, in the process of fault detection, the fault detection module 22 is specifically used to determine the fault of the high voltage component G to be detected if the first electrical signal to be detected is different from the reference level signal. The reference level signal is the first electrical signal to be detected corresponding to the high voltage component G to be detected in the normal state. For example, continue to refer to FIG. 2, since when the high voltage component G to be detected is in normal operating state, the voltage of the first target electrical signal is greater than the voltage of the first reference potential, the driving unit 211 drives the first switching unit 212 to turn on, and the first electrical signal to be detected is a low level signal. Therefore, based on the circuit shown in FIG. 2, the reference level signal is a low level signal. However, if the high voltage component G to be detected is in an open circuit state or has short-connected ground fault, the voltage of the first target electrical signal is less than or equal to the voltage of the first reference potential, at this time the first switching unit 211 is in off state, and the first electrical signal to be detected is a high level signal. Therefore, after determining that the first electrical signal to be detected is a high level signal, the fault of the high voltage component G to be detected can be determined by the fault detection module 22.

In some embodiments, referring to FIG. 2, in order to protect the driving unit 211, a first resistor module R4 is also arranged between the input terminal $P_1$ of the driving unit 211 and one terminal $Q_1$ of the high voltage component G to be detected. Wherein the first resistor module R4 may include one or more resistors. The first resistor module R4 may also be realized as other modules with protection function, and the embodiments of the present application is not limited to this. By setting the first resistor module R4, damage to the driving unit 211 can be prevented when the high voltage component to be detected is short-connected to the power supply.

In some embodiments, the high voltage interlock device 20 also includes a first filtering module. Referring to FIG. 2, the first filtering module includes a first resistor unit R5 and a first capacitor unit C1. One terminal of the first resistor unit R5 is connected to the output terminal $P_2$ of the signal isolation conversion module, and the other terminal of the first resistor unit R5 is connected to the fault detection module 22. In addition, the other terminal of the first resistor unit R5 is also connected to a fourth reference potential through the first capacitor unit C1. For example, as shown in FIG. 2, the other terminal of the first resistor unit R5 is also connected to a fourth ground GND4 through the first capacitor unit C1.

By setting the first filtering unit, the noise and high-frequency component in the first electrical signal to be detected can be filtered, thus ensuring the quality of the first electrical signal to be detected.

In some embodiments, referring to FIG. 2, in order to ensure the driving unit, the high voltage interlock device 20 also includes a first capacitor module C2 across the driving unit 211. In one example, the first capacitor module C2 can be realized as a capacitor, or connected by multiple capacitors in series, parallel, or mixed connection.

Figure 4:
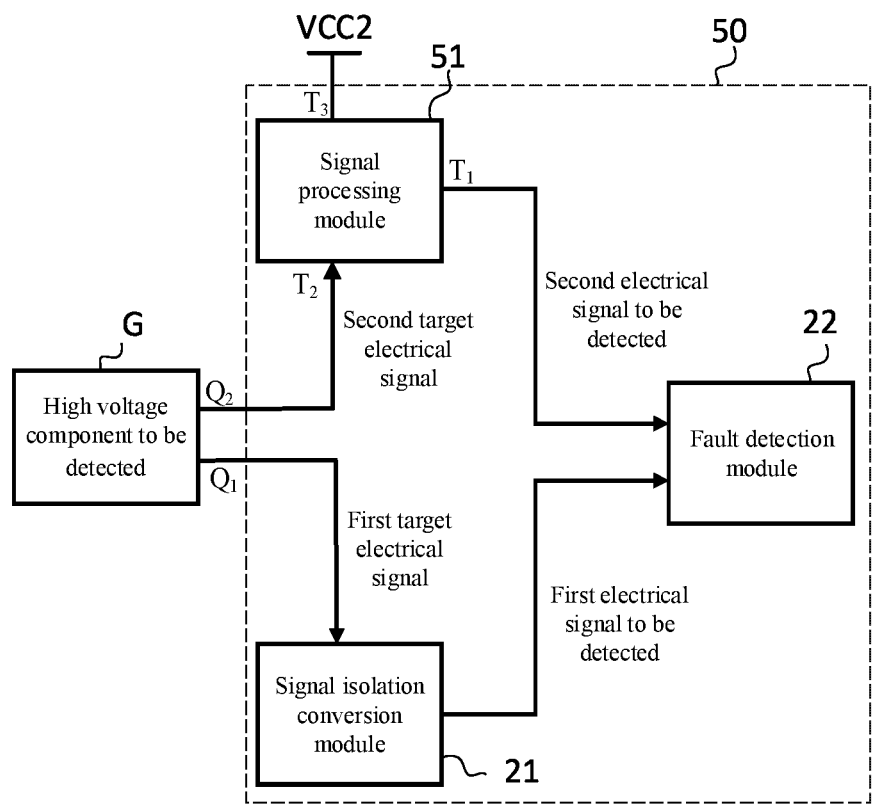
FIG. 4 is a structural diagram for another high voltage interlock device according to the embodiments of the application.

FIG. 4 is a structural diagram of another high voltage interlock device according to the embodiments of the application. The high voltage interlock device shown in FIG. 4 is similar to that in FIG. 1, except that the high voltage interlock device also includes a signal processing module 51 as shown in FIG. 4.

The signal processing module 51 is arranged between the other terminal $Q_2$ of the high voltage component G to be detected and the first power supply terminal VCC2, and the output $T_1$ of the signal processing module 51 is connected to the fault detection module 22. The signal processing module 51 is used to output a second electrical signal to be detected to the fault detection module 22 according to a second target electrical signal at the other terminal $Q_2$ of the high voltage component G to be detected. For example, the second target electrical signal may be a voltage difference between a first connection terminal $T_2$ and a second connection terminal $T_3$ of the signal processing module 51.

The fault detection module 22 is specifically used for determining the fault of the high voltage component to be detected according to the first electrical signal to be detected and the second electrical signal to be detected.

In one embodiment, the signal processing module 51 may include a first voltage dividing unit and a second switching unit. One terminal of the first voltage dividing unit is connected to the first power supply terminal, and the other terminal of the first voltage dividing unit is connected to one terminal of the second switching unit. The other terminal of the second switching unit is respectively connected to the fault detection module 22 and the other terminal of the high voltage component G to be detected.

Figure 5:
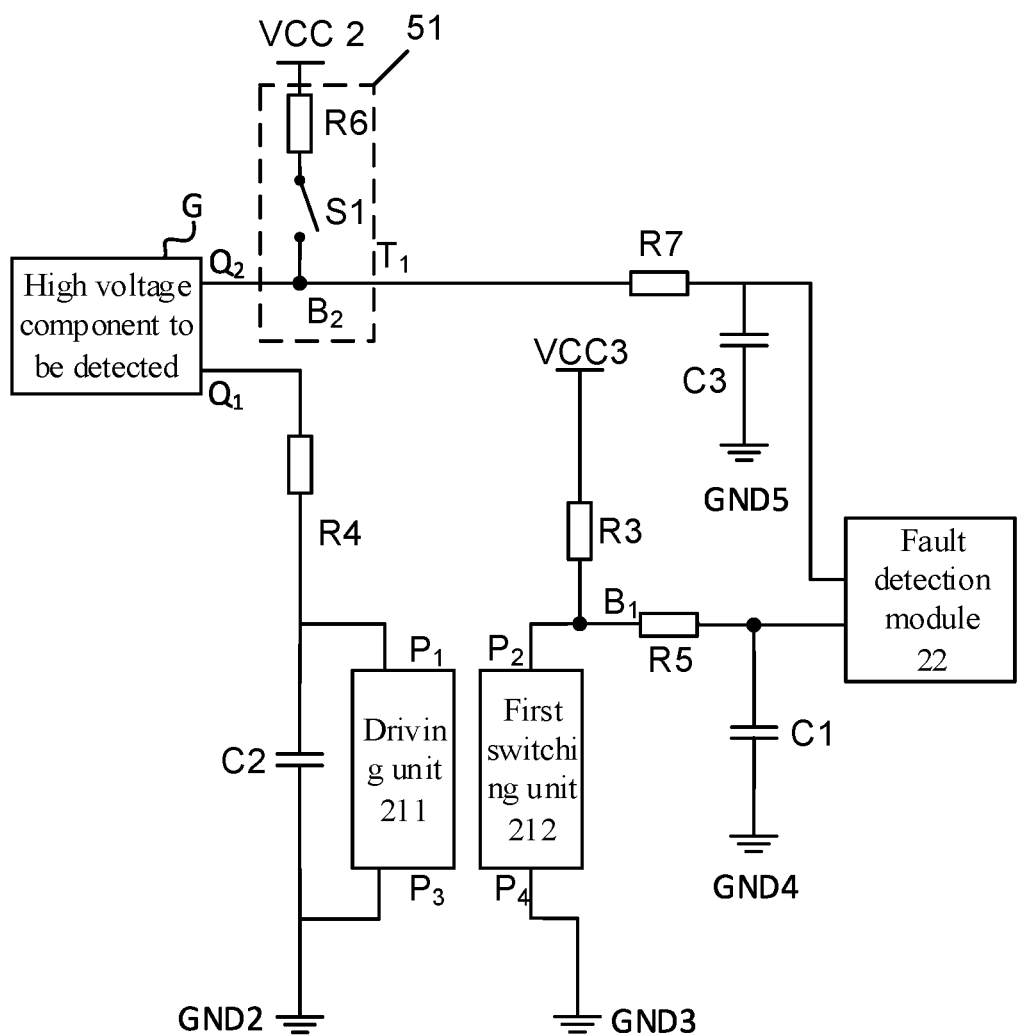
FIG. 5 is a structural diagram for another exemplary high voltage interlock device according to the embodiments of the application.

For example, as shown in FIG. 5, it is a structural diagram for another exemplary high voltage interlock device according to the embodiments of the application. The first voltage dividing unit may include a first voltage dividing unit R6, and the second switching unit may include a second switching unit S1. The other terminal of the second switching unit S1 may be directly connected to the line between the other terminal $Q_2$ of the high voltage component G to be detected and the fault detection module 22. At this time, in an ideal state, if the resistance on the line between the other terminal $Q_2$ of the high voltage component G to be detected and the fault detection module 22 is ignored, the second target electrical signal can be considered to be equal to the second electrical signal to be detected. The first electrical signal to be detected and the second electrical signal to be detected collected from the high voltage interlock device shown in FIG. 5 can be seen in Table 1 below.

TABLE 1

| Status of high voltage component G to be detected | Second switching unit S1 | First electrical signal to be detected | Second electrical signal to be detected |
| --- | --- | --- | --- |
| Normal state | Turn off | High level | Low level |
|  | Turn on | Low level | High level |
| Short-connected power supply fault | Turn off | Low level | High level |
|  | Turn on | Low level | High level |
| Open circuit fault | Turn off | High level | Low level |
|  | Turn on | High level | High level |
| Short-connected ground fault | Turn off | High level | Low level |
|  | Turn on | High level | Low level |

In the following parts of this embodiment, the first electrical signal to be detected and the second electrical signal to be detected will be specifically described in combination with table 1, the state of the high voltage component g to be detected and on/off state of the second switching unit S1.

(1) If the high voltage component G to be detected is in normal state. Referring to table 1, for the first electrical signal to be detected, according to the circuit and related analysis contents shown in the above embodiments, if the second switching unit S1 is turned off, the driving unit 211 cannot drive the first switching unit 212 to turn on, and at this time, the first electrical signal to be detected is a high-level signal. However, if the second switching unit S1 is turned on, the driving unit 211 can drive the first switching unit 212 to turn on. At this time, the first electrical signal to be detected is a low level signal.

For the second electrical signal to be detected, the voltage at the sampling point $B_2$ is smaller when the second switching unit S1 is off than that when the second switching unit S1 is on. Therefore, if the second switching unit S1 is off, the second electrical signal to be detected is a low level signal. However, if the second switching unit S1 is on, the second electrical signal to be detected is a high level signal.

(2) If the high voltage component G to be detected has short-connected power supply fault. Continue to refer to table 1, the voltage across the high voltage component G to be detected is always greater than 0. At this time, regardless of whether the second switching unit S1 is on or not, the driving unit 211 can drive the first switching unit 212 to turn on, and the first electrical signal to be detected is a low level signal. Moreover, regardless of whether the second switching unit S1 is on or not, the second electrical signal to be detected is a high level signal.

It can be found from table 1 that if the second switching unit S1 is off, when the high voltage component g to be detected has a short power failure, then the first electrical signal to be detected is a low-level signal, and the second electrical signal to be detected is a high-level signal. Therefore, the short-connected power supply fault of the high voltage component G to be detected can be diagnosed according to the first electrical signal to be detected and/or the second electrical signal to be detected collected when the second switching unit S1 is in off state.

(3) If the high voltage component G to be detected has an open circuit fault, the driving unit 211 is unable to drive the first switching unit 212 to turn on regardless of whether the second switching unit S1 is on, and the first electrical signal to be detected is a high-level signal.

For the second electrical signal to be detected, if the second switching unit S1 is off, the second electrical signal to be detected is a low level signal. If the second switching unit S1 is on, the second electrical signal to be detected is a high level signal.

It can be found from table 1 that if the second switching unit S1 is on, when the high voltage component G to be detected has an open circuit fault, then the first electrical signal to be detected is a high-level signal and the second electrical signal to be detected is a high-level signal. Therefore, the open circuit fault of the high voltage component G to be detected can be diagnosed by combining the collected first electrical signal to be detected and the second electrical signal to be detected when the second switching unit S1 is in on state.

(4) When the high voltage component G to be detected has a short-circuit fault, in an ideal state, the voltage across of the high voltage component G to be detected is always 0. Regardless of whether the second switching unit S1 is on or not, the driving unit 211 cannot drive the first switching unit 212 to turn on, and the first electrical signal to be detected is a high level signal. Moreover, the second electrical signal to be detected is a low level signal regardless of whether the second switching unit S1 is on or not.

It can be found from table 1 that if the second switching unit S1 is on, when the high voltage component G to be detected has a short-connected ground fault, the first electrical signal to be detected is a high-level signal and the second electrical signal to be detected is a low-level signal. Therefore, the short-connected ground fault of the high voltage component G to be detected can be diagnosed by combining the first electrical signal to be detected and the second electrical signal to be detected collected when the second switching unit S1 is in on state.

Based on the above analysis, it can be seen that in this embodiment, the fault detection module 22 can not only determine the fault of the high voltage component G to be detected occurs, but also detect the specific fault type of the high voltage component G to be detected.

Specifically, the fault detection module 22 is specifically used for: if the first electrical signal to be detected obtained when the second switching unit S1 is in off state is a low-level signal, and/or the second electrical signal to be detected obtained when the second switching unit S1 is in off state is a high-level signal, then determining that the high voltage component G to be detected has a short-connected power supply fault.

Moreover, the fault detection module 22 is further specifically used to determine that an open circuit fault occurs in the high voltage component g to be detected if the first to be detected electrical signal and the second to be detected electrical signal obtained when the second switching unit S1 is in the on state are high-level signals.

Moreover, the fault detection module 22 is also specifically used for: if the first electrical signal to be detected obtained when the second switching unit S1 is in on state is a high-level signal and the second electrical signal to be detected is a low-level signal, then determining that the high voltage component G to be detected has a short-connected ground fault.

In addition, according to the above analysis, the fault detection module 22 can not only detect the specific fault type of the high voltage component G to be detected, but also determine whether the fault is normal or not.

Accordingly, the fault detection module 22 is specifically used for: if the first electrical signal to be detected obtained when the second switching unit is in off state is a high-level signal and the second electrical signal to be detected is a low-level signal. If the first electrical signal to be detected obtained when the second switching unit S1 is in on state is a low-level signal and the second electrical signal to be detected is a high-level signal, then it is determined that the high voltage component G to be detected is normal.

In a specific example, the diagnosis process of the fault detection module 22 can be as follows: first controlling the second switching module S1 to be in off state, to diagnose whether the high voltage component G to be detected has a short-connected power supply fault; then controlling the second switching module S1 to be in on state, to determine whether the high voltage component G to be detected is normal according to the first signal to be detected, if not, then determining whether it is short-connected ground fault or open circuit fault according to the second signal to be detected.

Accordingly, the high voltage interlock device 30 also includes a control module for controlling on-off state of the second switching unit S1. The on-off module is specifically used to control the second switching unit S1 to switch from off state to on state. For example, the control module can be implemented as vehicle control unit (Vehicle control unit, VCU), motor control unit (Motor Control Unit, MCU) or battery management system (Battery Management System, BMS).

Accordingly, in this example, the fault detection module 22 is specifically used to: when the second switching unit S1 is in off state, if the obtained first electrical signal to be detected is a low-level signal, and/or if the obtained second electrical signal to be detected is a high-level signal, then determining that the high voltage component G to be detected has a short-connected power supply fault. Otherwise, the fault detection module 22 determines that the high voltage component G to be detected has no short-connected power supply fault.

The fault detection module 22 can also be specifically used for: if the first electrical signal to be detected obtained when the second switching unit S1 is in off state is a high-level signal, and/or the second electrical signal VS21 to be detected when the second switching unit S1 is in off state is a low-level signal, then the first electrical signal to be detected is obtained when the second switching unit S1 is in on state.

The fault detection module 22 can also be specifically used for: if the first electrical signal to be detected obtained when the second switching unit S1 is in off state is a high-level signal, then it is determined that the high voltage component to be detected is normal, otherwise the second electrical signal to be detected when the second switching unit S1 is in on state is obtained.

The fault detection module 22 can also be specifically used for: if the second electrical signal to be detected obtained when the second switching unit S1 is in off state is a high-level signal, then it is determined that the high voltage component G to be detected has a short-connected power supply fault.

The fault detection module 22 can also be specifically used for: if the second electrical signal to be detected obtained when the second switching unit S1 is in off state is a high-level signal, then it is determined that the high voltage component G to be detected has an open circuit fault.

By this example, when the second switching unit S1 is in off state, if it is determined that the short power failure occurs, then the control module can stop the switching operation from off state to on state, so as to avoid the damage to the power supply terminal caused by the short-connected power supply fault.

In some embodiments, the high voltage interlock device 30 also includes a second filtering module. Referring to FIG. 5, the second filtering module includes a second resistor unit R7 and a second capacitor unit C3. Wherein one terminal of the second resistor unit R7 is connected to the output $T_1$ of the signal processing module, and the other terminal of the second resistor unit R7 is connected to the fault detection module 22. In addition, the other terminal of the second resistor unit R7 is connected to a fifth reference potential through the second capacitor unit C3. For example, as shown in FIG. 2, the other terminal of the second resistor unit R7 is also connected to a fifth ground GND5 through the second capacitor unit C3.

By setting the second filtering unit, the noise and high-frequency component in the second electrical signal to be detected can be filtered, thus ensuring the quality of the second electrical signal to be detected.

In combination with the embodiments shown in FIG. 4 and FIG. 5, the signal processing module 51 may include a first voltage dividing unit and a second switching unit.

The difference between the embodiments of FIG. 4 and FIG. 5 is that in another embodiment, the signal processing module 51 may include a signal isolation conversion unit.

The first connection terminal $T_2$ of the signal isolation conversion unit is connected to the first power supply terminal VCC2, the second connection terminal $T_3$ of the signal isolation conversion unit is connected to the other terminal $Q_2$ of the high voltage component G to be detected, and the output $T_1$ of the signal isolation conversion unit is connected to the fault detection module 22. The signal isolation conversion unit is used to convert the second target electrical signal into the second electrical signal to be detected on the premise of ensuring that the high voltage component G to be detected is isolated from the fault detection module 22, and send the second electrical signal to be detected to the fault detection module 22.

In some embodiments, the signal isolation conversion unit includes a sub driving unit and a sub switching unit arranged in isolation. For example, FIG. 6 is a structural diagram for another exemplary high voltage interlock device according to the embodiments of the application.

Figure 6:
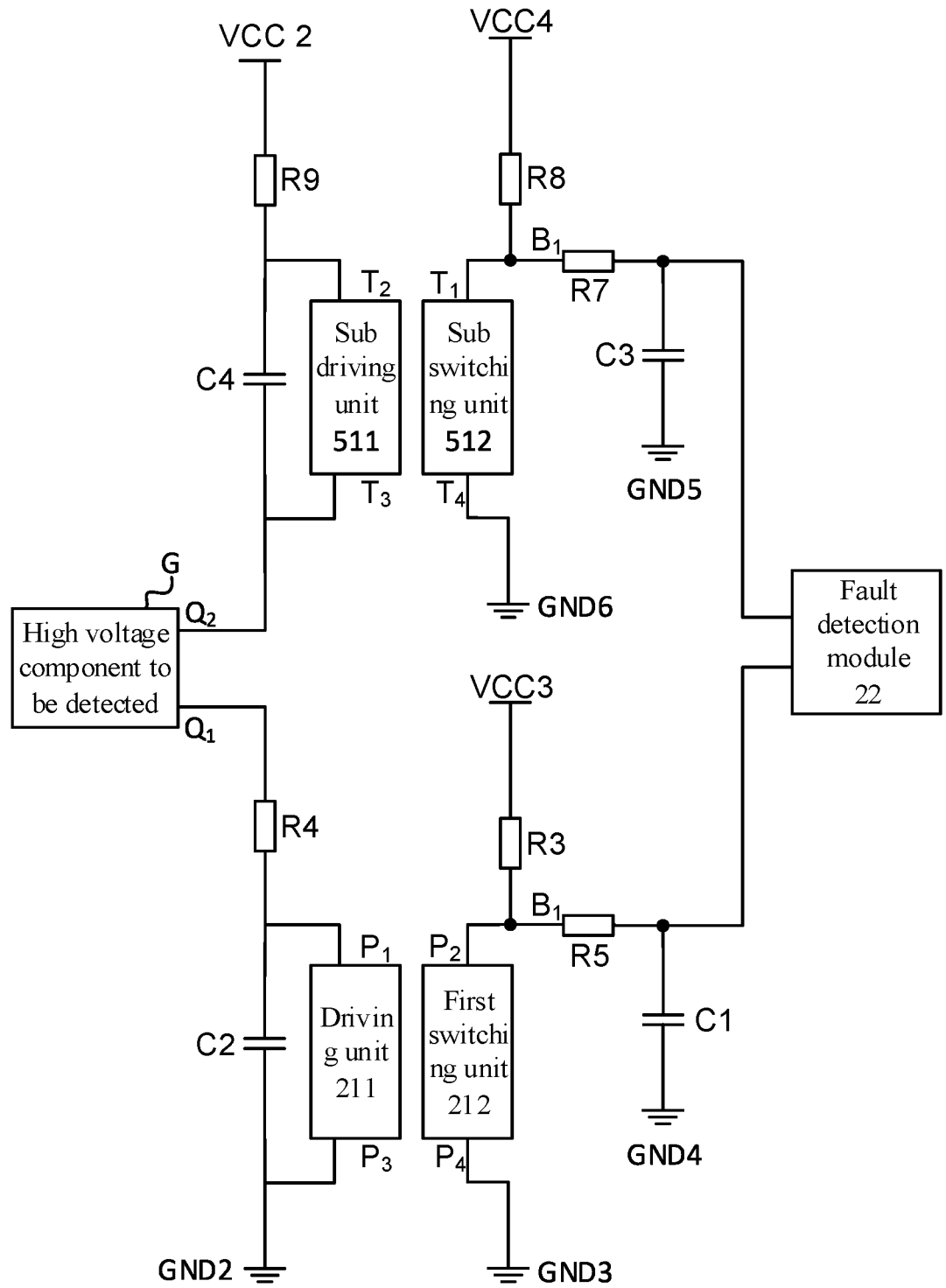
FIG. 6 is a structural diagram for yet another exemplary high voltage interlock device according to the embodiments of the application.

As shown in FIG. 6, one terminal $T_2$ of the sub driving unit 511 is used as the first connection terminal $T_2$ of the signal isolation conversion unit, and one terminal $T_2$ of the sub driving unit 511 is connected to the first power supply terminal VCC2. The other terminal $T_3$ of the sub driving unit 511 is used as the second connection terminal of the signal isolation conversion unit. Specifically, the other terminal $T_3$ of the sub driving unit 511 is connected to the other terminal $Q_2$ of the high voltage component G to be detected.

One terminal $T_1$ of the sub switching unit 512 is used as the output $T_1$ of the signal isolation conversion unit, one terminal $T_1$ of the sub switching unit 512 is connected to the third power supply VCC4 through the second voltage dividing module R8, and one terminal $T_1$ of the sub switching unit 512 is also connected to the fault detection module 22. The other terminal $T_4$ of the sub switching unit 512 is connected to the fifth reference potential. For example, the other terminal $T_4$ of the sub switching unit 512 is connected to the fifth ground terminal GND6. Wherein the second voltage dividing module R8 can be specifically implemented as one or more resistors. It should be noted that the second voltage dividing module can also be realized as other devices or modules with voltage dividing function, which is not limited.

It should be noted that in the embodiments of the application, the first reference potential to the fourth reference potential can be the same or different reference potential, which is not limited. For the specific content of the third power supply terminal VCC4, please refer to the related description of the second power supply terminal VCC3, which will not be repeated here. In addition, the second power supply terminal VCC3 and the third power supply terminal VCC4 can be the same voltage or different power supply, which is not limited.

The sub driving unit 511 is used to drive the sub switching unit 512 to turn on and turn off. Specifically, if the second target electrical signal is a low-level signal, the sub driving unit drives the sub switching unit to turn on, and the second electrical signal to be detected is a low-level signal; and if the second target electrical signal is a high-level signal, the sub switching unit is in off state, and the second electrical signal to be detected is a high-level signal. For other specific contents and working principles of the sub driving unit 511 and the sub switching unit 512, please refer to the relevant description of the driving unit 211 and the first sub switching unit 212 in the above-mentioned embodiments of the present application, which will not be repeated here.

The first electrical signal to be detected and the second electrical signal to be detected collected from the high voltage interlock device shown in FIG. 6 can be seen in Table 2 below.

TABLE 2

| Status of high voltage component G to be detected | First electrical signal to be detected | Second electrical signal to be detected |
| --- | --- | --- |
| Normal state | Low level | Low level |
| Short-connected power supply fault | Low level | High level |
| Open circuit fault | High level | High level |
| Short-connected ground fault | High level | Low level |

In the following parts of this embodiment, the first electrical signal to be detected and the second electrical signal to be detected will be specifically described in combination with table 2 and the state of the high voltage component G to be detected.

(1) If the high voltage component G to be detected is in normal state, a path is formed between the first power supply terminal VCC2 and the first reference potential. Starting from the second power supply terminal VCC2, the potential of each point on the path decreases gradually. Referring to table 2, for the first electrical signal to be detected, according to the circuit shown in the above embodiment and related analysis, the driving unit 211 can drive the first switching unit 212 to turn on. At this time, the first electrical signal to be detected is a low-level signal. For the second electrical signal to be detected, the sub driving unit 511 can drive the sub switching unit 512 to turn on, and the second electrical signal to be detected is a low level signal.

(2) If the high voltage component G to be detected has a short-connected power supply fault. The voltage across the high voltage component G to be detected is always greater than 0. At this time, referring to table 2, the driving unit 211 can drive the first switching unit 212 to turn on, and the first electrical signal to be detected is a low level signal. However, the sub driving unit 511 cannot drive the sub switching unit 512 to turn on, and the second electrical signal to be detected is a high level signal.

(3) If the high voltage component G to be detected has an open circuit fault, the driving unit 211 cannot drive the first switching unit 212 to turn on, and the first electrical signal to be detected is a high-level signal. The sub driving unit 511 cannot drive the sub switching unit 512 to turn on, and the second electrical signal to be detected is a high level signal.

(4) When the high voltage component G to be detected has a short-connected ground fault, in an ideal state, the voltage across the high voltage component G to be detected is always 0. The driving unit 211 cannot drive the first switching unit 212 to turn on, and the first electrical signal to be detected is a high level signal. However, there is a voltage difference between the second power supply terminal VCC2 and the high voltage component G to be detected, the sub driving unit 511 can drive the sub switching unit 512 to turn on, and the second electrical signal to be detected is a low level signal.

Based on the above analysis, it can be seen that in this embodiment, the fault detection module 22 can not only determine the fault of the high voltage component G to be detected, but also the specific fault type of the high voltage component G to be detected.

Specifically, the fault detection module 22 is specifically used for: if the first electrical signal to be detected is a low-level signal and the second electrical signal to be detected is a high-level signal, it is determined that the high voltage component to be detected has a short-connected power supply fault.

And the fault detection module 22 is also specifically used for: if the first electrical signal to be detected is a high-level signal and the second electrical signal to be detected is a high-level signal, it is determined that the high voltage component G to be detected has an open circuit fault.

And the fault detection module 22 is also specifically used for: if the first electrical signal to be detected is a high-level signal and the second electrical signal to be detected is a low-level signal, it is determined that the high voltage component G to be detected has a short-connected ground fault.

In addition, according to the above analysis, the fault detection module 22 can not only detect the specific fault type of the high voltage component G to be detected, but also determine whether the fault detection module 22 is normal or not.

Accordingly, the fault detection module 22 is specifically used to determine that the high voltage component G to be detected is normal if the first electrical signal to be detected is a low-level signal and the second electrical signal to be detected is a low-level signal.

In some embodiments, referring to FIG. 6, in order to protect the sub driving unit, a second resistor module R9 is also provided between one terminal T2 of the sub driving unit 511 and the first power supply terminal VCC1. The second resistor module R9 may include at least one resistor. By setting the second resistor module R9, the damage to the sub driving unit 511 can be prevented when the high voltage component to be detected is short connected to ground.

In some embodiments, a second filtering module is also arranged between the output terminal $T_1$ of the signal isolation conversion unit and the fault detection module 22. The specific content of the second filtering module can be seen in the relevant description of the above-mentioned embodiments of the present application, and will not be repeated here.

In some embodiments, referring to FIG. 6, in order to ensure the sub driving unit, the high voltage interlock device also includes a second capacitor module C4 across the sub driving unit 511. In one example, the second capacitor module C4 can be realized as one capacitor, or connected by multiple capacitors in series, parallel, or mixed connection.

Figure 7:
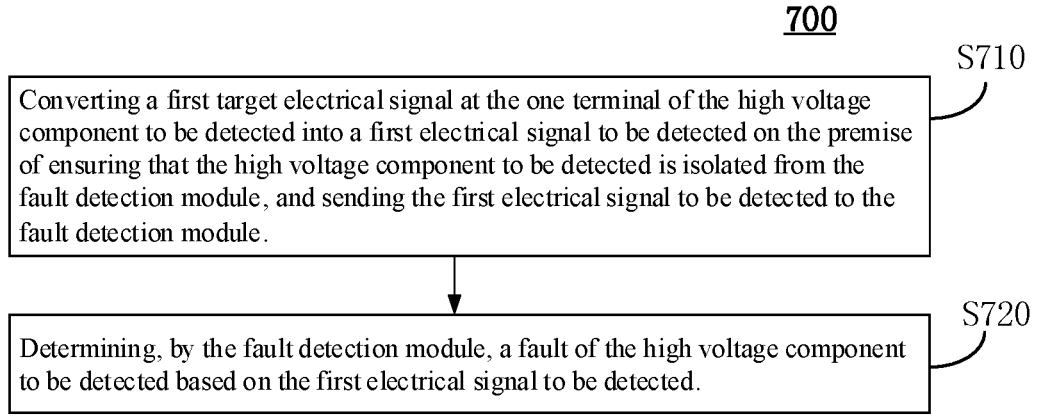
FIG. 7 shows a flow diagram for a detection method of a high voltage interlock device according to the embodiments of the application.

FIG. 7 shows a flow diagram for a detection method of a high voltage interlock device according to the embodiments of the application. The method can be applied to the high voltage interlock device 20 shown in FIG. 1 to FIG. 6. A detection method 700 for the high voltage interlock device includes S710 and S720.

S710, the signal isolation conversion module 21 is configured to convert the first target electrical signal at one terminal $Q_1$ of the high voltage component G to be detected into the first electrical signal to be detected on the premise of ensuring that the high voltage component G to be detected is isolated from the fault detection module 22, and transmit the first electrical signal to be detected to the fault detection module 22.

S720, the fault detection module 22 is configured to determine the fault of the high voltage component G to be detected based on the first electrical signal to be detected.

In some embodiments of the present application, S720 specifically includes: if the first electrical signal to be detected is different from the reference electrical signal, the fault of the high voltage component g to be detected is determined by the fault detection module 22.

The reference electrical signal represents the first electrical signal to be detected corresponding to the high voltage component G to be detected in the normal state.

In some embodiments of the present application, the high voltage interlock device as shown in FIG. 4 also includes a signal processing module 51. For the relevant description of the signal processing module 51, please refer to the above-mentioned embodiment of the present application, and it will not be repeated here. Before S720, the detection method 700 for the high voltage interlock device also includes:

Outputting the second electrical signal to be detected to the fault detection module 22 by the signal processing module 51 according to the second target electrical signal at the other terminal $Q_2$ of the high voltage component G to be detected.

Accordingly, S720 specifically includes: determining the fault of the high voltage component G to be detected by the fault detection module 22 according to the first electrical signal to be detected and the second electrical signal to be detected.

In some embodiments, if the signal processing module 51 includes a second switching unit S1 as shown in FIG. 5. For the specific content of S1, please refer to the related description of the above-mentioned embodiments of the present application.

Accordingly, S720 specifically includes:

If the first electrical signal to be detected obtained when the second switching unit is in off state is a low-level signal, and/or the second electrical signal to be detected obtained when the second switching unit is in off state is a high-level signal, it is determined that the high voltage component to be detected has a short-connected power supply fault.

If both the first electrical signal to be detected obtained when the second switching unit is in on state and the second electrical signal to be detected obtained when the second switching unit is in on state are high-level signals, it is determined that the high voltage component to be detected has an open circuit fault.

If the first electrical signal to be detected obtained when the second switching unit is in on state is a high-level signal, and the second electrical signal to be detected obtained when the second switching unit is in on state is a low-level signal, it is determined that the high voltage component to be detected has a short-connected ground fault.

In addition, the detection method 700 for the high voltage interlock device may also include:

The fault detection module 22 is used to determine that the high voltage component to be detected is normal, if the first electrical signal to be detected obtained when the second switching unit is in off state is a high-level signal, the second electrical signal to be detected obtained when the second switching unit is in off state is a low-level signal, the first electrical signal to be detected obtained when the second switching unit is in on state is a low-level signal, and the second electrical signal to be detected obtained when the second switching unit is in on state is a high-level signal.

In some embodiments, the high voltage interlock device also includes a control module, and S720 specifically includes the following seven steps.

In the first step, on the basis that the control module of the high voltage interlock device controls the second switching unit to be in off state, if the first electrical signal to be detected obtained when the second switching unit in off state is a low-level signal, and/or if the second electrical signal to be detected obtained when the second switching unit is in off state is a high-level signal. The fault detection module is configured to determine the high voltage component to be detected has a short-connected power supply fault.

In the second step, if the first electrical signal to be detected obtained when the second switching unit is in off state is a high-level signal, and/or if the second electrical signal to be detected obtained when the second switching unit is in off state is a low-level signal, the control module controls the second switching unit to switch from off state to on state. And the fault detection module is configured to obtain the first electrical signal to be detected when the second switching unit is in on state and the second electrical signal to be detected when the second switching unit is in on state.

The third step is to determine whether the first electrical signal to be detected is a low level signal when the second switching unit is in on state.

In the fourth step, if it is determined that the first electrical signal to be detected is a low-level signal when the second switching unit is in on state, then the fault detection module determines that the high voltage component to be detected is normal.

In the fifth step, if the first electrical signal to be detected obtained when the second switching unit is in on state is a high-level signal, then it is determined that whether the second electrical signal to be detected when the second switching unit is in on state is a low-level signal.

In the sixth step, if it is determined that the second electrical signal to be detected obtained when the second switching unit is in on state is a low-level signal, it is determined by the fault detection module that the high voltage component to be detected has a short-connected ground fault.

In the seventh step, if it is determined that the second electrical signal to be detected obtained when the second switching unit is in on state is a high-level signal, it is determined that the high voltage component to be detected has an open circuit fault.

In some embodiments, if the high voltage interlock device also includes the signal isolation conversion unit shown in FIG. 6. Before S720, the detection method of the high voltage interlock device also includes: converting the second target electrical signal into the second electrical signal to be detected by the signal isolation conversion unit on the premise of ensuring that the high voltage component to be detected is isolated from the fault detection module, and sending the second electrical signal to be detected to the fault detection module.

In some embodiments, if the high voltage interlock device is the high voltage interlock device shown in FIG. 6, S720 includes:

If the first electrical signal to be detected is a low level signal and the second electrical signal to be detected is a high level signal, it is determined that the high voltage component to be detected has a short-connected power supply fault.

If the first electrical signal to be detected is a high-level signal and the second electrical signal to be detected is a high-level signal, it is determined that the high voltage component to be detected has an open circuit fault.

If the first electrical signal to be detected is a high-level signal and the second electrical signal to be detected is a low-level signal, it is determined that the high voltage component to be detected has a short-connected ground fault.

In one embodiment, if the high voltage interlock device is the high voltage interlock device shown in FIG. 6, the detection method 700 for the high voltage interlock device further includes:

If the first electrical signal to be detected is a low-level signal and the second electrical signal to be detected is a low-level signal, it is determined that the high voltage component to be detected is normal.

Other details of the detection method of the high voltage interlock device according to the embodiments of the present application are similar to those of the high voltage interlock device described above in combination with the examples shown in FIGS. 1 to 6, and can achieve the corresponding technical effect. For the sake of brevity, it will not be repeated here.

It should be clear that all the embodiments in this specification are described in a progressive manner, and the same or similar parts of the embodiments can be referred to each other. Each embodiment focuses on the differences from other embodiments. For the simple method embodiment, please refer to the description of high voltage interlock circuit for relevant points. The present application is not limited to the specific steps and structures described above and shown in the FIG.s. Those skilled in the art can make various changes, modifications and additions, or change the order of steps after understanding the spirit of the application. Moreover, for the sake of brevity, a detailed description of known methods and techniques is omitted here.

The functional module in the above embodiments can be implemented as hardware, software, firmware or a combination thereof. When the functional module is implemented in hardware, it may be, for example, an electronic circuit, an application specific integrated circuit (ASIC), an appropriate firmware, a plug-in, a function card, and the like. When it is implemented in software, the elements of the present application are programs or code segments used to perform required tasks. The programs or code segments can be stored in a machine-readable medium, or transmitted on the transmission medium or communication link through the data signal carried in the carrier. "Machine readable medium" may include any medium capable of storing or transmitting information.

Although the present application has been described with reference to the preferred embodiments, various improvements can be made and the components thereof can be replaced with equivalents without departing from the scope of the present application. In particular, as long as there is no structural conflict, the technical features mentioned in each embodiment can be combined in any way. The present application is not limited to the specific embodiments disclosed herein, but includes all technical solutions falling within the scope of the claims.

What is claimed is:

1. A high voltage interlock circuit comprising:
a signal isolation conversion module, an input terminal of the signal isolation conversion module is connected to one terminal of a high voltage component to be detected, and an output terminal of the signal isolation conversion module is connected to a fault detection module, the signal isolation conversion module is configured to convert a first target electrical signal at the one terminal of the high voltage component to be detected into a first electrical signal to be detected on the premise of ensuring that the high voltage component to be detected is isolated from the fault detection module, wherein the other terminal of the high voltage component to be detected is connected to a first power supply terminal;
a signal processing module arranged between the other end of the high voltage component to be detected and the first power supply terminal, the output terminal of the signal processing module is connected to the fault detection module, and the signal processing module is configured to output the second electric signal to be detected to the fault detection module according to a second target electrical signal at the other terminal of the high voltage component to be detected;
the fault detection module is specifically configured to determine the fault of the high voltage component to be detected according to the first electrical signal to be detected and the second electrical signal to be detected.

2. The high voltage interlock device of claim 1, wherein the fault detection module is configured to:
determine the fault of the high voltage component to be detected if the first electrical signal to be detected is different from a reference level signal, wherein the reference level signal is the first electrical signal to be detected corresponding to the high voltage component to be detected in normal state.

3. The high voltage interlock device of claim 1, wherein, the signal isolation conversion module comprises a driving unit and a first switching unit arranged in isolation, wherein
one terminal of the driving unit is acted as the input terminal of the signal isolation conversion module, the other terminal of the driving unit is connected to a first reference potential, one terminal of the first switching unit is acted as the output terminal of the signal isolation conversion module, and the output terminal of the signal isolation conversion module is also connected to a second power supply terminal via the first voltage dividing module, the other end of the first switching unit is connected to a second reference potential;
the driving unit is configured to drive the first switching unit to turn on and off, if the first target electrical signal is a high level signal, the first switching unit is driven by the driving unit to turn on, and the first electrical signal to be detected is a low level signal; and if the first target electrical signal is a low level signal, the first switching unit is driven by the driving unit to turn off, and the first electrical signal to be detected is a high level signal.

4. The high voltage interlock device of claim 3, wherein, the driving unit comprises a light emitting element; and the first switching unit comprises an optical switch.

5. The high voltage interlock device of claim 1, wherein the signal processing module comprises:
a first voltage dividing unit, one terminal of the first voltage dividing unit is connected to the first power supply terminal, and the other end of the first voltage dividing unit is connected to one terminal of the second switching unit;
a second switching unit, the other terminal of the second switching unit is respectively connected to the fault detection module and the other terminal of the high voltage component to be detected.

6. The high voltage interlock device of claim 5, wherein the fault detection module is specifically configured to:
determine that the high voltage component to be detected has a short-connected power supply fault, if the first electrical signal to be detected obtained when the second switching unit is in off state is a low level signal, and/or the second electrical signal to be detected obtained when the second switching unit is in off state is a high level signal;
determine that the high voltage component to be detected has an open circuit fault, if both the first electrical signal to be detected and the second electrical signal to be detected obtained when the second switching unit is in on state is a high level signal;

determine that the high voltage component to be detected has short-connected ground fault, if the first electrical signal to be detected obtained when the second switching unit is in on state is a high level signal, and the second electrical signal to be detected obtained when the second switching unit is in on state is a low level signal.

7. The high voltage interlock device of claim 5, wherein the fault detection module is further configured to:

determine that the high voltage component to be detected is normal, if the first electrical signal to be detected obtained when the second switching unit is in off state is a high level signal, the second electrical signal to be detected obtained when the second switching unit is in off state is a low level signal, the first electrical signal to be detected obtained when the second switching unit is in on state is a low level signal, and the second electrical signal to be detected obtained when the second switching unit is in on state is a high level signal.

8. The high voltage interlock device of claim 5, further comprising: a control module for controlling the second switching unit to switch from off state to on state, wherein the fault detection module is configured to:

in case that the second switching unit is in off state, determine that the high voltage component to be detected has a short-connected power supply fault, under a condition that the first electrical signal to be detected obtained when the second switching unit is in off state is a low level signal, and/or the second electrical signal to be detected obtained when the second switching unit is in off state is a high level signal; in case that the second switching unit is in on state, obtain the first electrical signal to be detected obtained when the second switching unit is in on state, under a condition that the first electrical signal to be detected obtained when the second switching unit is in off state is a high level signal, and/or the second electrical signal to be detected obtained when the second switching unit is in off state is a low level signal;

determine that the high voltage component to be detected is normal if the first electrical signal to be detected obtained when the second switching unit is in on state is a low level signal;

obtain the second electrical signal to be detected when the second switching unit is in on state if the first electrical signal to be detected obtained when the second switching unit is in on state is a high level signal;

determine that the high voltage component to be detected has a short-connected ground fault if the second electrical signal to be detected obtained when the second switching unit is in on state is a low level signal;

determine that the high voltage component to be detected has an open circuit fault if the second electrical signal to be detected obtained when the second switching unit is in on state is a high level signal.

9. The high voltage interlock device of claim 1, wherein the signal processing module includes:

a signal isolation conversion unit, a first connection terminal of the signal isolation conversion unit is connected to the first power supply terminal, a second connection terminal of the signal isolation conversion unit is connected to the other terminal of the high voltage component to be detected, and an output terminal of the signal isolation conversion unit is connected to the fault detection module, the signal isolation conversion unit is configured to convert the second target electrical signal into the second electrical signal to be detected on the premise of ensuring that the high voltage component to be detected is isolated from the fault detection module, and send the second electrical signal to be detected to the fault detection module.

10. The high voltage interlock device of claim 9, wherein the fault detection module is specifically configured to:

determine that the high voltage component to be detected has a short-connected power supply fault, if the first electrical signal to be detected is a low level signal and the second electrical signal to be detected is a high level signal;

determine that the high voltage component to be detected has an open circuit fault, if the first electrical signal to be detected is a high level signal and the second electrical signal to be detected is a high level signal;

determine that the high voltage component to be detected has a short-connected ground fault, if the first electrical signal to be detected is a high level signal and the second electrical signal to be detected is a low level signal.

11. The high voltage interlock device of claim 9, wherein, the fault detection module is further configured to:

determine that the high voltage component to be detected is normal, if the first electrical signal to be detected is a low level signal and the second electrical signal to be detected is a low level signal.

12. The high voltage interlock device of claim 9, wherein the signal isolation conversion unit comprises a sub driving unit and an sub switching unit arranged in isolation, wherein one terminal of the sub driving unit is acted as the first connection terminal of the signal isolation conversion unit, the other terminal of the sub driving unit is acted as the second connection terminal of the signal isolation conversion unit, one terminal of the sub switching unit is acted as the output terminal of the signal isolation conversion unit, the output terminal of the signal isolation conversion unit is also connected to a third power supply terminal through a second voltage dividing module, and the other terminal of the sub switching unit is connected to a fifth reference potential;

the sub driving unit is configured to drive the sub switching unit to turn on and off, if the second target electrical signal is a low-level signal, then the sub switching unit is driven by the sub driving unit to turn on, and the second electrical signal to be detected is a low level signal; and if the second target electrical signal is a high level signal, then the sub switching unit is in off state, and the second electrical signal to be detected is a high level signal.

13. The high voltage interlock device of claim 1, further comprising:

a first filter module comprising a first resistor unit and a first capacitor unit, one terminal of the first resistor unit is connected to the output terminal of the signal isolation conversion module, and the other terminal of the first resistor unit is connected to the fault detection module, the other terminal of the first resistor unit is also connected to a fourth reference potential via the first capacitor unit.

14. The high voltage interlock device of claim 1, further comprising:
a second filter module comprising a second resistor unit and a second capacitor unit, one terminal of the second resistor unit is connected to the output terminal of the signal processing module, and the other terminal of the second resistor unit is connected to the fault detection module, the other terminal of the second resistor unit is also connected to a fifth reference potential via the second capacitor unit.

15. The high voltage interlock device of claim 3, further comprising:
a first resistor module arranged between the driving unit and the high voltage component to be detected; and/or
a first capacitor module across the driving unit.

16. The high voltage interlock device of claim 12, further comprising:
a second resistor module arranged between the sub driving unit and the first power supply terminal; and/or
a second capacitor module across the sub driving unit.

17. A detection method for a high voltage interlock device, applied to the high voltage interlock device of claim 1, and the detection method comprises:
converting, by a signal isolation conversion module, a first target electrical signal at one terminal of a high voltage component to be detected into a first electrical signal to be detected on the premise of ensuring that the high voltage component to be detected is isolated from a fault detection module;
outputting, by a signal processing module (51), a second electric signal to be detected to the fault detection module (22) according to a second target electrical signal; and
determining, by the fault detection module, a fault of the high voltage component to be detected based on the first electrical signal to be detected and the second electrical signal to be detected.

* * * * *